United States Patent [19]

Shimoyama et al.

[11] Patent Number: 5,684,599
[45] Date of Patent: Nov. 4, 1997

[54] WAFER NOTCH DIMENSION MEASURING APPARATUS

[75] Inventors: Shigetoshi Shimoyama; Kaneyoshi Aramaki, both of Fukushima-ken, Japan

[73] Assignee: Shin-Etsu Handotai Co., Ltd., Tokyo, Japan

[21] Appl. No.: 673,477

[22] Filed: Jul. 1, 1996

Related U.S. Application Data

[63] Continuation of Ser. No. 394,569, Feb. 27, 1995, abandoned.

[30] Foreign Application Priority Data

Mar. 25, 1994 [JP] Japan ..................... 6-55604

[51] Int. Cl.$^6$ ................................. G01B 11/00
[52] U.S. Cl. ............... 356/400; 250/559.29; 250/548
[58] Field of Search ..................... 356/399–401, 356/372, 373, 375, 426, 150; 355/43, 53; 250/559.29, 548

[56] References Cited

U.S. PATENT DOCUMENTS 4,097,158  6/1978  Dehait .
4,639,604  1/1987  Murakami et al. .
4,907,035  3/1990  Galburt et al. .................. 356/400 X
5,438,209  8/1995  Yamamoto et al. ............. 250/559.29

FOREIGN PATENT DOCUMENTS 47811   4/1974  Australia .
435057  7/1991  European Pat. Off. .

*Primary Examiner*—K. Hantis
*Attorney, Agent, or Firm*—Nikaido, Marmelstein, Murray & Oram LLP

[57] ABSTRACT

An apparatus capable of concurrently measuring the depth and angle of a notch in the peripheral edge of a wafer includes: a unit for rotating the wafer; a wafer edge detector, including a light-emitting unit and a photo-detecting unit arranged to read the shape of the peripheral edge of the wafer, for outputting a wafer edge detecting signal corresponding to the shape of the peripheral edge of the wafer; a wafer rotational angular position detector for detecting the rotational angular position of the wafer being rotated and outputting a wafer rotational angular position detecting signal; and an arithmetical unit for computing the dimensions of the notch from the wafer edge detecting signal and the wafer rotational angular position detecting signal.

1 Claim, 3 Drawing Sheets

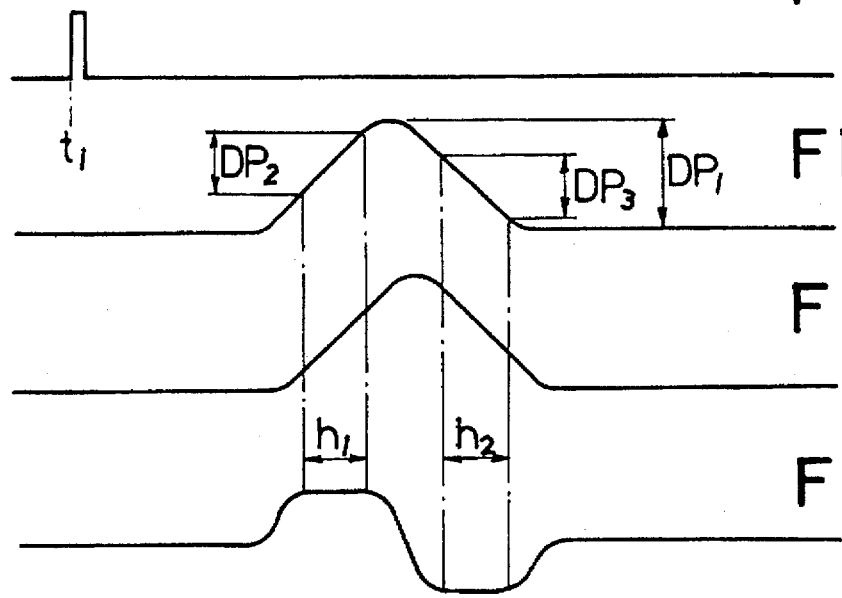
FIG. 4(a)
FIG. 4(b)
FIG. 4(c)
FIG. 4(d)
FIG. 5
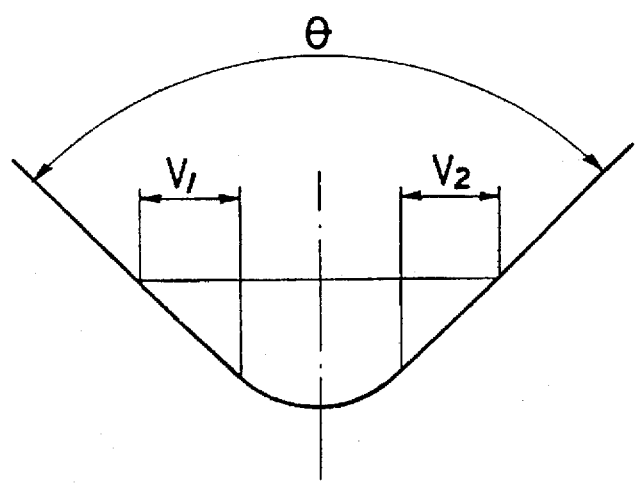

WAFER NOTCH DIMENSION MEASURING APPARATUS

This application is a continuation of application Ser. No. 08/394,569 filed Feb. 27, 1995 now abandoned.

BACKGROUND OF THE INVENTION

1. Field of the Invention

The present invention relates to an apparatus for measuring the dimensions or size of a notch which is provided in the peripheral edge of a wafer for positioning the wafer.

2. Description of the Related Art

Conventionally, a universal profile projector is generally used as a wafer notch dimension measuring apparatus. In the universal profile projector, the wafer is placed on a stage, and a notched wafer portion is projected on an enlarged scale or magnification on a rotary screen for measuring the dimensions or size of a notch.

The conventional wafer notch dimension measuring method using the universal profile projector cannot measure the depth and angle of a notch concurrently. During measurement, a reference line is brought into alignment with appropriate peripheral portions of the notch by the operator, and depending on the amount of linear movement of the stage and the amount of angular movement of the rotary screen, the depth and angle of the notch are reckoned. Such a manual measuring method is time consuming and encounters a problem that the measured values tend to vary or scatter within a certain range depending on the operator.

SUMMARY OF THE INVENTION

It is accordingly an object of the present invention to provide a wafer notch dimension measuring apparatus which is capable of measuring the depth and angle of a notch concurrently in a short period of time without involving a problem that the measured values tend to scatter depending on the operator.

To attain the foregoing object, the present invention seeks to provide an apparatus for measuring the dimensions of a notch in the peripheral edge of a wafer, which apparatus comprises: (a) means for rotating the wafer; (b) wafer edge detecting means, including a light-emitting unit and a photo-detecting unit arranged to read the shape of the peripheral edge of the wafer, for outputting a wafer edge detecting signal corresponding to the shape of the peripheral edge of the wafer; (c) wafer rotational angular position detecting means for detecting the rotational angular position of the wafer being rotated and outputting a wafer rotational angular position detecting signal; and (d) arithmetical means for computing the dimensions of the notch from the wafer edge detecting signal and the wafer rotational angular position detecting signal.

With the apparatus thus constructed, the notch dimensions or size is measured by irradiating the wafer edge with parallel rays of light to obtain a wafer edge detecting signal and arithmetically operating the wafer edge detecting signal, and not by measuring an enlarged silhouette of the notch.

According to the wafer notch dimension measuring apparatus of the present invention, parallel rays of light emitted from the light-emitting unit toward the photo-detecting unit of the photoelectric sensor is irradiated over the peripheral edge of the wafer to obtain a differential signal of the wafer edge detecting signal corresponding to the shape of the peripheral edge of the wafer. The wafer edge detecting signal, the differential signal of the wafer edge detecting signal and the wafer rotational angular position detecting signals are arithmetically operated to measure the dimensions or size of the notch with high accuracy.

The above and other objects, features and advantages of the present invention will become manifest to those versed in the art upon making reference to the detailed description and the accompanying sheets of drawings in which a preferred structural embodiment incorporating the principle of the present invention is shown by way of illustrative example.

BRIEF DESCRIPTION OF THE DRAWINGS

FIG. 4 is a diagram showing waveforms illustrative of operation of the circuit shown in FIG. 3; and FIG. 5 is an enlarged view showing the shape of a notch of a wafer to be measured by the wafer notch dimension measuring apparatus of this invention.

DETAILED DESCRIPTION OF THE INVENTION

Figure 1:
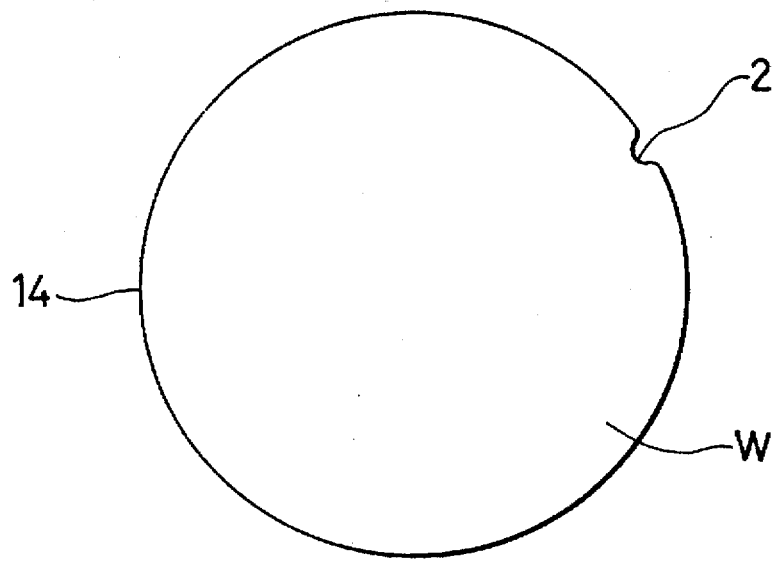
FIG. 1 is a plan view of a wafer having a notch to be measured by a wafer notch dimension measuring apparatus according to the present invention.

As shown in FIG. 1, a wafer W has in its peripheral edge a notch 2 to be measured by an apparatus according to the present invention. The wafer W is placed on a table 4 such that the center of the wafer W is aligned with the axis of rotation of the table 4. The wafer W thus placed is held immovable on the table 4 by a suitable holding means, such as a vacuum holder (not shown). A wafer edge detecting means 10 is composed of a light-emitting unit 6 and a photo-detecting unit 8 that are arranged in confronted relation across the peripheral edge of the wafer W. The light-emitting unit 6 includes a light source, such as a light-emitting diode. The photo-detecting unit 8 may be a photosensor including a photoelectric transducer, such as a photodiode.

The light-emitting unit 6 and the photo-detecting unit 8 are positioned relative to the edge of the wafer W such that when a circular portion 14 of the wafer edge (i.e., the portion excluding the notch 2) is present between the two units 6 and 8, parallel rays of light emitted from the light-emitting unit 6 are mostly blocked by the wafer edge and only a slight portion of the parallel rays comes in the photo-detecting unit 8, and when the notch 2 is present between the two unit 6 and 8, the quantity of light incident on the photo-detecting unit 8 increases greatly. The table 4 is rotated by a motor 16 via a suitable power transmission mechanism (not shown).

Figure 2:
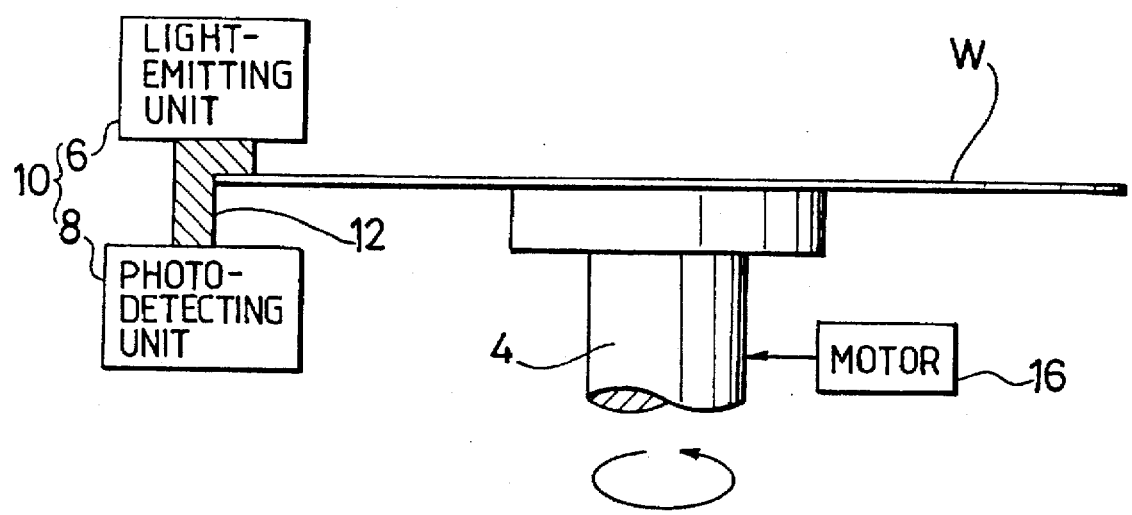
FIG. 2 is a diagrammatical side view showing a wafer periphery detecting means of the apparatus including a light-emitting unit and a photo-detecting unit arranged in confrontation across the peripheral edge of the wafer.
Figure 3:
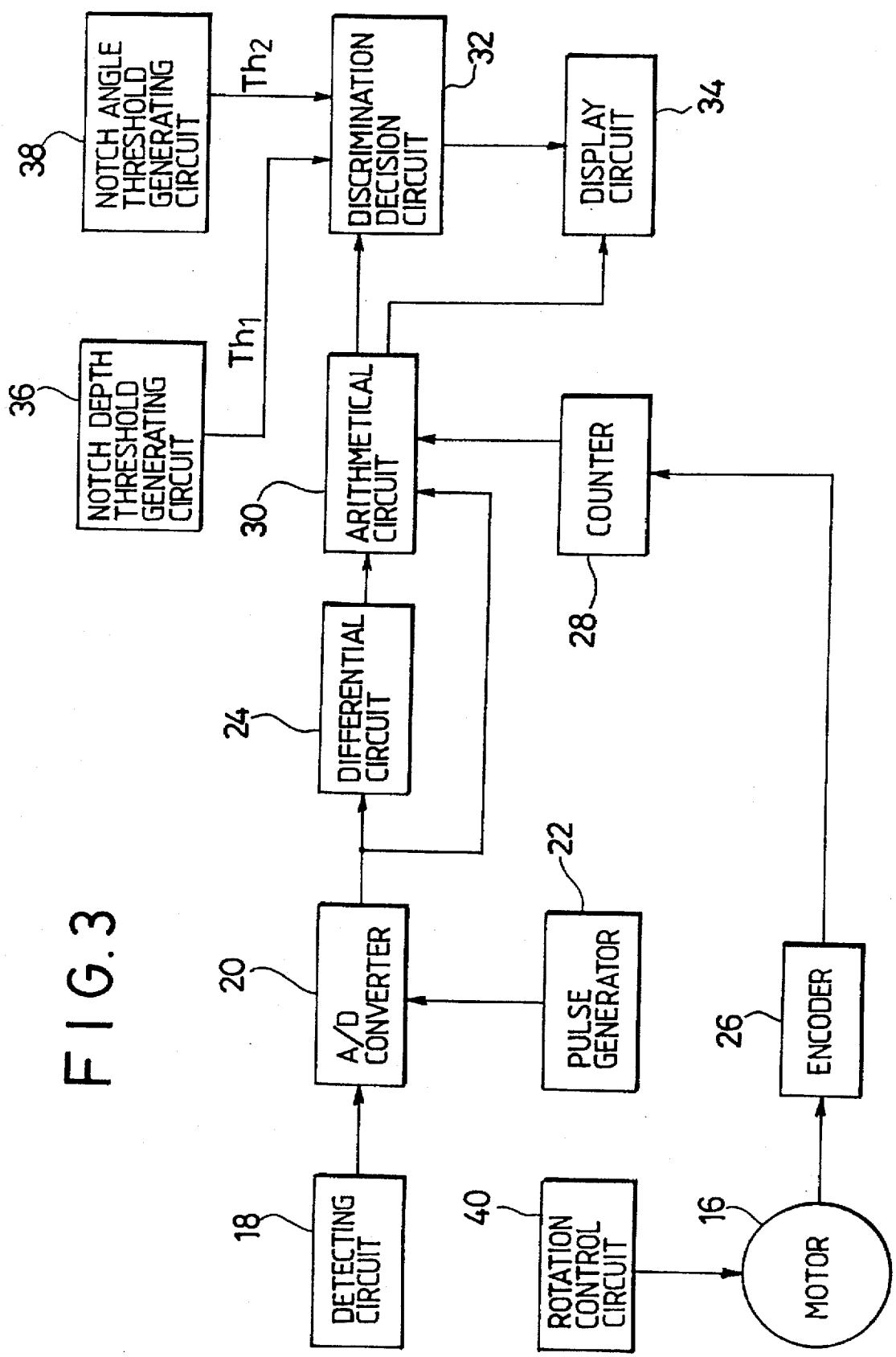
FIG. 3 is a block diagram showing the relation between various components of the apparatus.

A photoelectric conversion signal obtained from the photo-detecting unit 8 shown in FIG. 2 is amplified by an amplifier (not shown) so that a detecting signal corresponding to the shape of the peripheral edge of the wafer W is produced. The thus produced wafer edge detecting signal is then output from a detecting circuit 18 shown in FIG. 3 to an analog-to-digital (A/D) converter 20.

The detecting signal supplied in the A/D converter 20 is converted into a digital signal which is synchronized with a sampling pulse supplied from a pulse generator 22. The thus digitized detecting signal is output to a differential circuit 24.

The digitized detecting signal which is input into the differential circuit 24 is branched into two, one being slightly delayed by passing it through a delay circuit in the differential circuit 24. The delayed detecting signal and the other detecting signal are subtracted by a subtracting circuit in the differential circuit 24 with the result that the detecting signal output from the detecting circuit 18 is converted into a differential signal through a digital signal processing operation.

Designated by 26 is an encoder provided for detecting a rotational angular position of the motor 16. The detected signal is input from the encoder 26 into a counter 28 which converts the detected signal into a wafer rotational angular position signal. The differentiated signal from the differential circuit 24, the detecting signal from the A/D converter 20, and the wafer rotational angular position signal from the counter 28 are input into an arithmetical circuit 30.

The arithmetical circuit 30 includes a microcomputer and computes the depth of the notch 2 and the angle of the notch 2 by appropriately processing the differential signal, the detection signal and the wafer rotational angular position signal with the use of software. The results of computation are output from the arithmetical circuit 30 to a discrimination decision circuit 32 and a display circuit 34. In the discrimination decision circuit 32, the computed notch depth and notch angle are respectively compared with a threshold $Th_1$ and a threshold $Th_2$ supplied respectively from a notch depth threshold generating circuit 36 and a notch angle threshold generating circuit 38. The results of discrimination decision obtained by the discrimination decision circuit 32 are output to the display circuit 34.

Designated by 40 is a rotation control circuit for controlling the motor 16 which may be composed of a pulse motor or is provided with a rotational angular position detector such as a rotary encoder.

Referring now to FIG. 4, a theoretical basis used for computing the notch depth and the notch angle will be described below in greater detail.

When a rotation start signal is generated at a time point $t_1$, as shown in FIG. 4(a), the motor 16 is started whereupon the table 4 and the wafer W set on the table 4 are rotated. Upon rotation of the wafer W, a detecting signal such as shown in FIG. 4(b) is generated.

Since the motor 16 rotates at a constant speed, the detecting signal shown in FIG. 4(b) is represented by a triangular waveform produced when the notch 2 is present between the light-emitting unit 6 and the photo-detecting unit 8. As described above, the detecting signal shown in FIG. 4(b) is converted by the A/D converter 20 into a digital signal which is in turn input into the differential circuit 24. For better understanding, however, analog waveforms will be used in the following description. FIG. 4(c) represents a delayed signal produced by slightly delaying the detecting signal of FIG. 4(b). FIG. 4(d) represents a differential signal produced by subtracting the delayed signal of FIG. 4(c) from the detecting signal of FIG. 4(b). The differential circuit 24 outputs a digital signal corresponding to the analog differential signal shown in FIG. 4(d). The signal shown in FIG. 4(d) is approximate to a differential signal of the signal shown in FIG. 4(b).

Since the center of the wafer W and the axis of rotation of the table 4 are not in exact alignment with each other, the center of the wafer W is computed from data about the circular portion 14 of the wafer edge, and appropriate correcting values are added to the detecting signal and the differential signal, in order to obtain data representing the condition when the wafer W is rotating about its center. Subsequently, the notch depth is arithmetically determined by subtraction between the circular portion 14 of the wafer W (i.e., the edge portion excluding the notch 2) and the peak value $DP_1$ of the notch 2. At straight portions $V_1$, $V_2$ of the notch 2 shown in FIG. 5, the differential signal becomes constant, as shown in FIG. 4(d). From widths $h_1$, $h_2$ of the differential signal obtained when the differential signal becomes constant, and variations $DP_1$, $DP_3$ of the detecting signal obtained at this time, the notch angle $\theta$ can be obtained using the following equation:

Notch angle $\theta$ (degree)$=\tan^{-1}(h_1/DP_2)+\tan^{-1}(h_2/DP_3)$

Using 10 sample wafers, and using the conventional universal profile projector (V-16E manufactured by Nikon Corporation) and the apparatus of the present invention, the notch depth and the notch angle were measured with the results shown in the appended Table 1.

It is apparent from Table 1, the measured values obtained by the inventive apparatus are substantially the same as those obtained by the conventional universal profile projector and only scatter within an extremely small range.

The measurement accuracy of the notch depth and notch angle is determined by the sensitivity of the photo-electric sensor, the resolution of the encoder, and the reduction ratio of the motor.

As described above, according to the present invention, parallel rays of light are emitted on the peripheral edge of a wafer being rotated so as to detect a signal corresponding to the shape of the wafer edge. The detected signal is subjected to arithmetic operations so that the notch dimensions or size of the wafer, namely, the notch depth and the notch angle of the wafer can be measured concurrently and rapidly with high accuracy in a non-contact manner. By using the apparatus of this invention, it is possible to overcome the conventional problem that the measured values vary or scatter depending on the operator.

Obviously, various minor changes and modifications of the present invention are possible in the light of the above teaching. It is therefore to be understood that within the scope of the appended claims the invention may be practiced otherwise than as specifically described.

TABLE 1(1)

Notch Depth:

| Wafer No. | Universal Profile Projector | Measured Values |
|---|---|---|
| | | Inventive Apparatus |

| Wafer No. | Universal Profile Projector | Average | Scatter | 1 | 2 | 3 | 4 | 5 |
|---|---|---|---|---|---|---|---|---|
| 1 | 1.202 | 1.203 | 0.002 | 1.202 | 1.203 | 1.202 | 1.204 | 1.204 |
| 2 | 1.265 | 1.263 | 0.005 | 1.261 | 1.260 | 1.262 | 1.265 | 1.265 |
| 3 | 1.202 | 1.203 | 0.005 | 1.200 | 1.202 | 1.203 | 1.203 | 1.205 |
| 4 | 1.264 | 1.265 | 0.002 | 1.263 | 1.265 | 1.265 | 1.265 | 1.265 |
| 5 | 1.272 | 1.270 | 0.004 | 1.269 | 1.273 | 1.269 | 1.271 | 1.270 |
| 6 | 1.206 | 1.205 | 0.005 | 1.203 | 1.208 | 1.208 | 1.205 | 1.203 |
| 7 | 1.262 | 1.262 | 0.005 | 1.260 | 1.265 | 1.264 | 1.260 | 1.262 |
| 8 | 1.268 | 1.267 | 0.005 | 1.266 | 1.267 | 1.270 | 1.265 | 1.265 |
| 9 | 1.215 | 1.216 | 0.003 | 1.218 | 1.215 | 1.216 | 1.218 | 1.215 |
| 10 | 1.186 | 1.187 | 0.004 | 1.188 | 1.187 | 1.189 | 1.185 | 1.186 |

TABLE 1(2)

Notch Angle:

| Wafer No. | Universal Profile Projector | Measured Values | | | | | | |
|---|---|---|---|---|---|---|---|---|
| | | Inventive Apparatus | | | | | | |
| | | Average | Scatter | 1 | 2 | 3 | 4 | 5 |
| 1 | 91°15' | 91°15' | 0°02' | 91°15' | 91°16' | 91°15' | 91°14' | 91°14' |
| 2 | 91°25' | 91°21' | 0°02' | 91°21' | 91°22' | 91°20' | 91°20' | 91°22' |
| 3 | 91°05' | 91°06' | 0°01' | 91°06' | 91°06' | 91°05' | 91°06' | 91°05' |
| 4 | 91°08' | 91°08' | 0°03' | 91°08' | 91°10' | 91°09' | 91°08' | 91°07' |
| 5 | 91°07' | 91°06' | 0°02' | 91°05' | 91°06' | 91°07' | 91°06' | 91°06' |
| 6 | 91°18' | 91°17' | 0°04' | 91°18' | 91°15' | 91°19' | 91°17' | 91°16' |
| 7 | 91°11' | 91°10' | 0°03' | 91°10' | 91°09' | 91°09' | 91°12' | 91°10' |
| 8 | 91°14' | 91°15' | 0°03' | 91°15' | 91°15' | 91°17' | 91°14' | 91°14' |
| 9 | 91°24' | 91°24' | 0°04' | 91°25' | 91°24' | 91°22' | 91°26' | 91°23' |
| 10 | 91°21' | 91°20' | 0°03' | 91°18' | 91°21' | 91°21' | 91°20' | 91°20' |

What is claimed is:

1. An apparatus for measuring the dimensions of a notch in the peripheral edge of a wafer including a radial depth of said notch and an opening angle of said notch, comprising:

(a) means for rotating the wafer;

(b) wafer edge detecting means, including a light emitting unit and a photo-detecting unit arranged to read the shape of the peripheral edge of the wafer, for outputting a wafer edge detecting signal corresponding to the shape of the peripheral edge of the wafer;

(c) wafer rotational angular position detecting means for detecting the rotational angular position of the wafer being rotated and outputting a wafer rotational angular position detecting signal;

(d) means receiving said wafer edge detecting signal and producing a differential signal therefrom; and (e) arithmetical means for computing the dimensions of the notch including said radial depth of said notch and said opening angle of said notch from said wafer edge detecting signal, said wafer rotational angular position detecting signal and said differential signal.

* * * * *